US008797744B2

(12) United States Patent  
Cawthon et al.

(10) Patent No.: US 8,797,744 B2  
(45) Date of Patent: Aug. 5, 2014

(54) DEVICE MOUNTING SYSTEMS AND METHODS

(75) Inventors: David W. Cawthon, Houston, TX (US); Jeffrey A. Lev, Tomball, TX (US); Mark S. Tracy, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 178 days.

(21) Appl. No.: 13/386,974

(22) PCT Filed: Aug. 18, 2009

(86) PCT No.: PCT/US2009/054233  
§ 371 (c)(1),  
(2), (4) Date: Jan. 25, 2012

(87) PCT Pub. No.: WO2011/022003  
PCT Pub. Date: Feb. 24, 2011

(65) Prior Publication Data  
US 2012/0127669 A1 May 24, 2012

(51) Int. Cl.  
*H05K 7/20* (2006.01)  
*G06F 1/20* (2006.01)

(52) U.S. Cl.  
USPC ...... 361/719; 361/679.54; 361/704; 361/709; 165/185

(58) Field of Classification Search  
USPC ............ 361/679.54, 704, 709–710, 715–716, 361/719–721; 165/185  
See application file for complete search history.

(56) References Cited

U.S. PATENT DOCUMENTS

| 5,995,371 | A | 11/1999 | Suzaki |
| 6,483,708 | B2 | 11/2002 | Ali et al. |
| 6,549,410 | B1 | 4/2003 | Cohen |
| 6,625,022 | B2 | 9/2003 | Frutschy et al. |
| 6,722,908 | B2 | 4/2004 | Llapitan et al. |
| 6,741,470 | B2 | 5/2004 | Isenburg |
| 6,751,098 | B2 | 6/2004 | Dailey et al. |
| 7,170,165 | B2 | 1/2007 | Berto et al. |
| 7,315,449 | B2 * | 1/2008 | Lewis ........................ 361/702 |
| 7,342,306 | B2 * | 3/2008 | Colbert et al. ............... 257/712 |
| 7,428,154 | B2 * | 9/2008 | Ishimine et al. ............. 361/704 |
| 7,443,676 | B1 | 10/2008 | Li |

(Continued)

FOREIGN PATENT DOCUMENTS

| JP | 6275328 | 9/1994 |
| JP | 2000-049447 | 2/2000 |
| JP | 2000-357866 | 12/2000 |

OTHER PUBLICATIONS

International Searching Authority, International Search Report and Written Opinion, Appln No. PCT/US2009/054233, Date of Mailing May 18, 2010, 13 p.

(Continued)

*Primary Examiner* — Robert J Hoffberg

(57) ABSTRACT

A device mounting system is provided. The device 720 can include a plurality of device mounting posts 730, 740. The system can further include a transition member 100 including an transition mounting feature 150 and at least one receiver 140 adapted to accommodate a first portion of the device mounting features 730. The system can also include a backing member 100 comprising at least one receiver 140 adapted to accommodate the remaining portion of the device mounting features 740 and a transition mounting receiver 240 adapted to accommodate, the transition mounting feature 150.

17 Claims, 6 Drawing Sheets

(56) References Cited

U.S. PATENT DOCUMENTS

| | | |
|---|---|---|
| 7,460,371 B2 | 12/2008 | Andberg et al. |
| 7,468,483 B2 * | 12/2008 | Yoshino .......................... 84/723 |
| 7,595,993 B2 * | 9/2009 | Mitsui et al. .................. 361/719 |
| 7,667,970 B2 * | 2/2010 | Ma et al. ....................... 361/704 |
| 7,697,296 B2 * | 4/2010 | Floyd et al. ................... 361/719 |
| 7,870,888 B2 * | 1/2011 | Zhou et al. ................... 165/80.3 |
| 2004/0084764 A1 * | 5/2004 | Ishimine et al. .............. 257/706 |
| 2005/0111197 A1 | 5/2005 | Lee et al. |
| 2007/0044945 A1 * | 3/2007 | Zhou et al. .................... 165/121 |
| 2008/0068805 A1 * | 3/2008 | Xu et al. ....................... 361/710 |
| 2009/0021917 A1 * | 1/2009 | Floyd et al. ................... 361/719 |
| 2009/0168355 A1 * | 7/2009 | Ma et al. ....................... 361/709 |

OTHER PUBLICATIONS

GB Examination Report Under Section 18 (3) received in GB Application No. 1201186.2, mailed Jun. 5, 2013, 2 pgs.

* cited by examiner

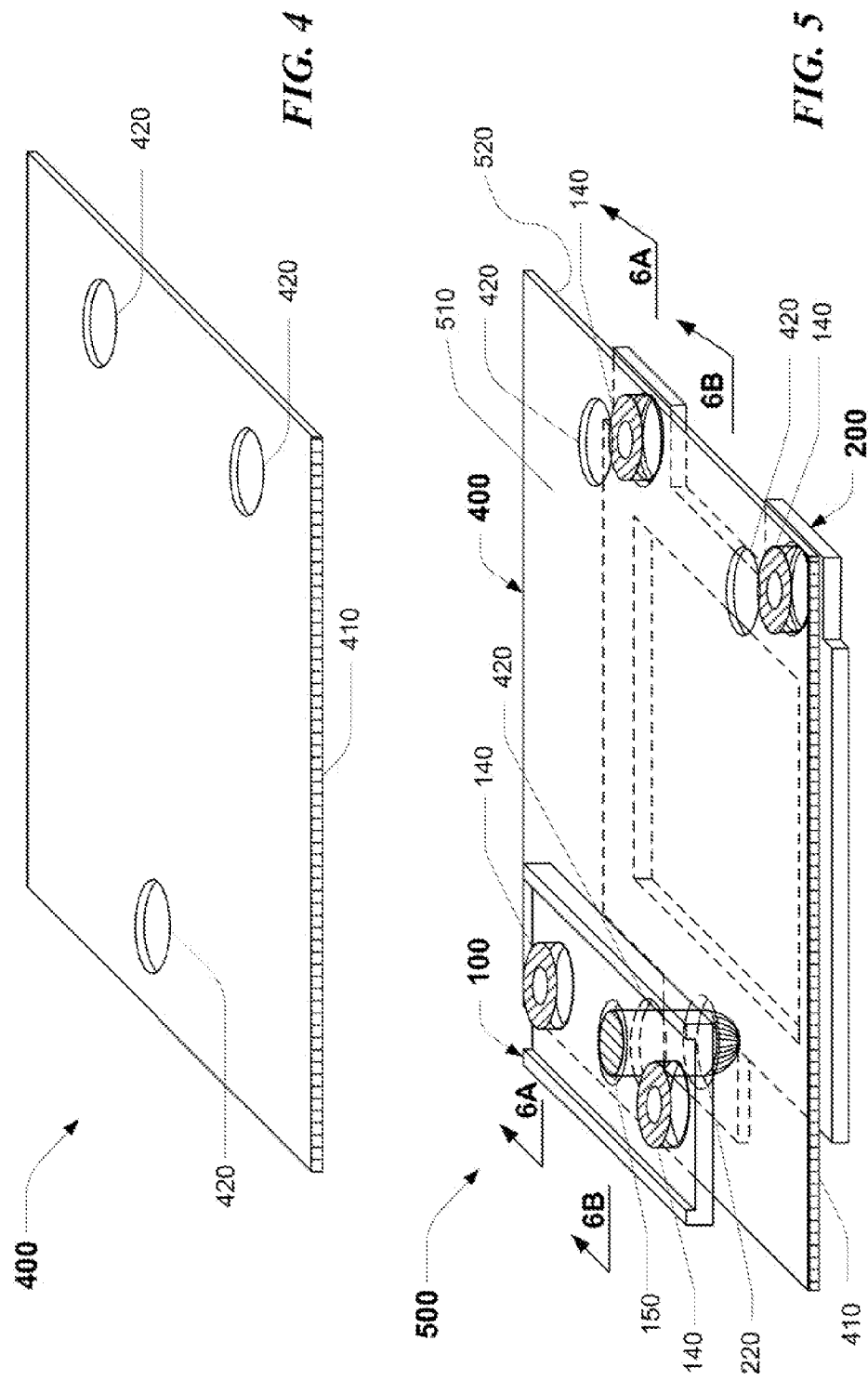

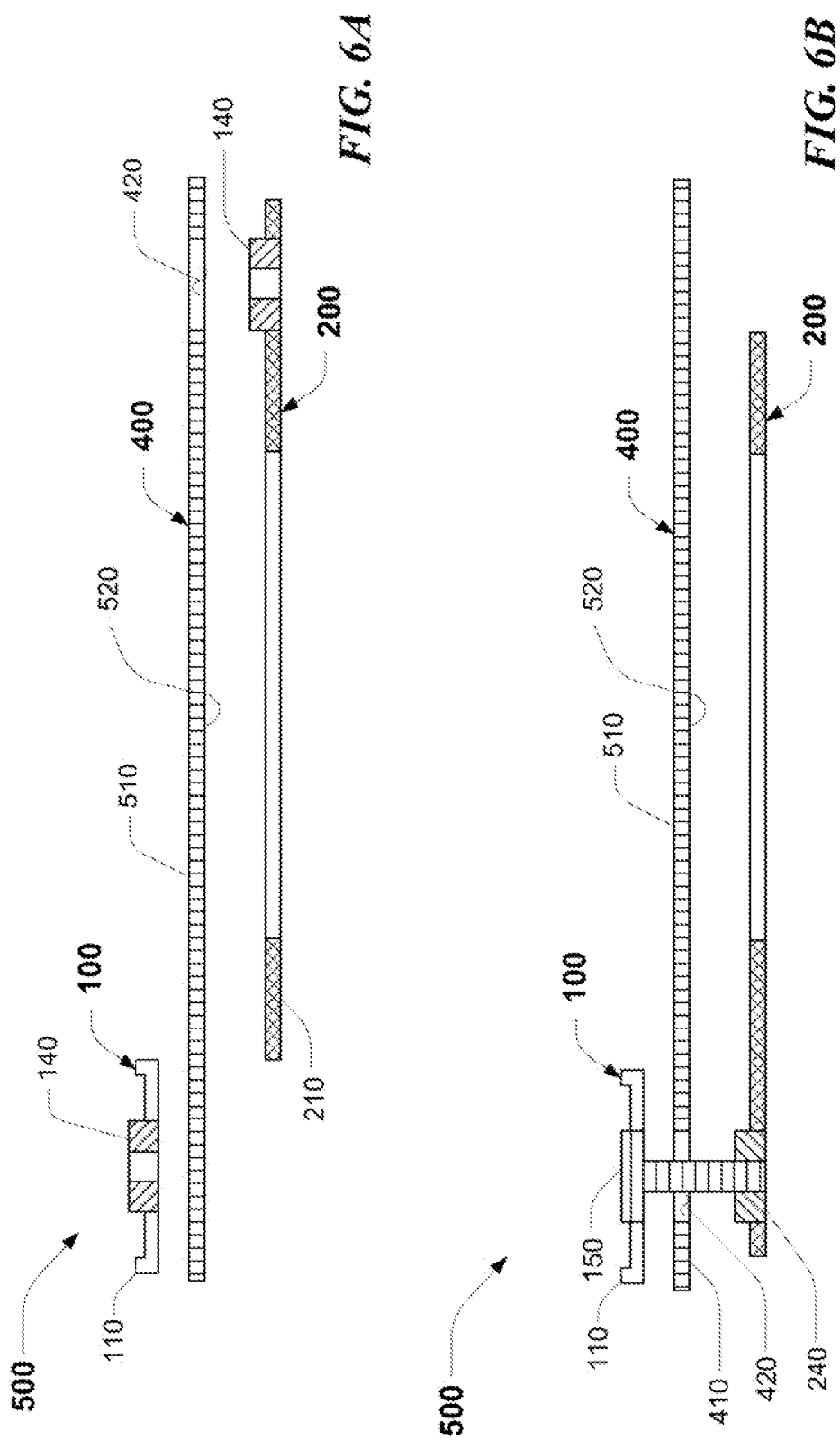

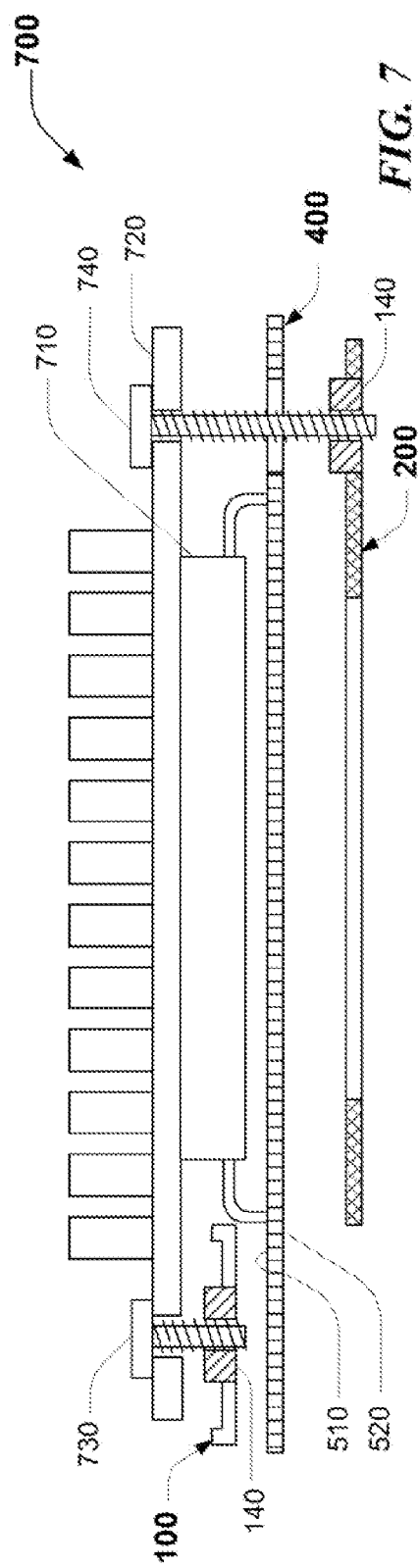
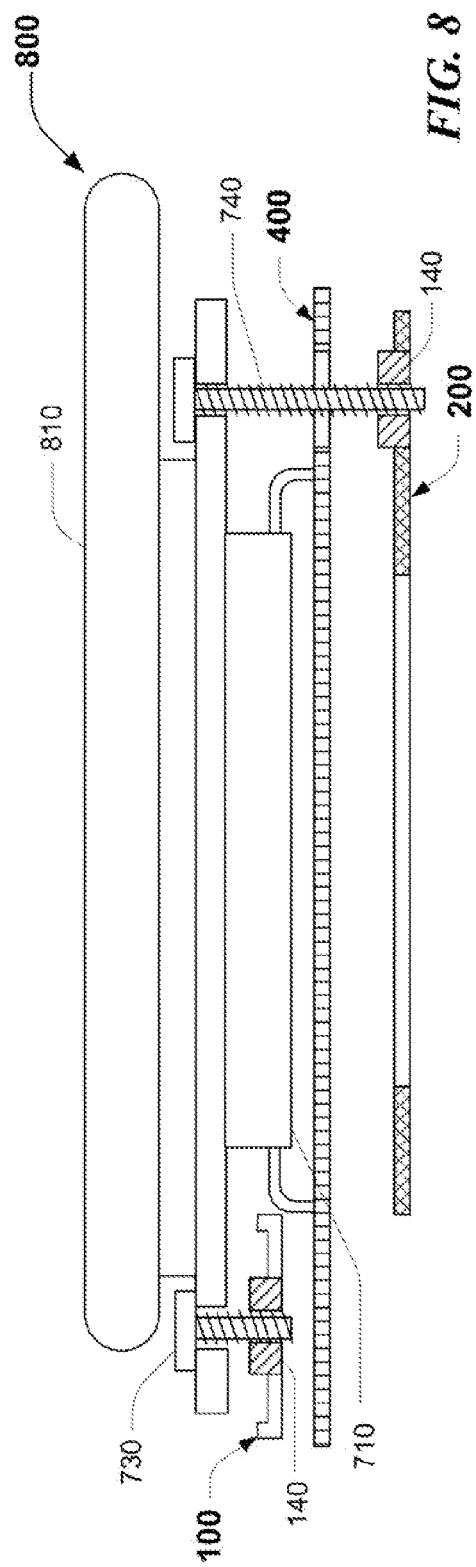

DEVICE MOUNTING SYSTEMS AND METHODS

BACKGROUND OF THE INVENTION

Description of the Related Art

The ever increasing miniaturization of solid state electronic devices such as central processing units and graphics processing units used within personal computing devices has enabled an ever-greater number of components to be mounted in an ever-decreasing footprint. While many advantages accrue as a result of this miniaturization, one undesirable consequence is the significant quantities of heat generated by these components.

Heat generated by solid state electronic devices mounted in an enclosure can be problematic, particularly when the enclosure itself is of minimal size, shape or footprint, such as a notebook, laptop, ultraportable or netbook computer. Frequently heat transfer enhancement devices, such as heat sinks having significant heat transfer area within a relatively small footprint are used to dissipate the heat generated by solid state electronic devices mounted in the enclosure. In order to maximize the effectiveness of these heat transfer enhancement devices, they must frequently be mounted proximate the heat generating solid state device. Since heat transfer enhancement devices are mounted to the same substrate as the solid state device, circuits entering and existing the solid state device must be routed around the heat transfer enhancement device mounting fixture.

SUMMARY OF THE INVENTION

A device mounting system is provided. The device can include a plurality of device mounting posts. The system can further include, a transition member including a transition mounting feature and at least one receiver adapted to accommodate a first portion of the device mounting features. The system can also include a backing member comprising at least one receiver adapted to accommodate the remaining portion of the device mounting features and a transition mounting receiver adapted to accommodate the transition mounting feature.

A device mounting method is also provided. The method can include disposing a transition member proximate a substrate comprising a first surface and a second surface. The transition member, including a transition mounting feature and at least one receiver, can be disposed proximate the first surface. A backing member, including at least one receiver and a transition mounting receiver adapted to accommodate the transition mounting feature, can be disposed proximate the second surface of the substrate. A device comprising a plurality of device mounting features can be attached to the transition member and the backing member. A first portion of the device mounting features can be disposed in at least a portion of the receivers disposed on the transition member. The remaining portion of the device mounting features can pass through substrate apertures and can be disposed in at least a portion of the receivers disposed on the backing member.

A device mounting apparatus is also provided. The apparatus can include a transition member having a plurality of receiver apertures disposed therethrough, a transition mounting feature, and at least one receiver at least partially disposed within at least a portion of the plurality of receiver apertures. The apparatus can further include a backing member having a plurality of apertures disposed therethrough, at least one receiver can be at least partially disposed within at least a portion of the apertures, and a transition mounting receiver can beat least partially disposed within an aperture. The transition mounting receiver can be adapted to accommodate at least a portion of the transition mounting feature.

BRIEF DESCRIPTION OF THE DRAWINGS

Advantages of one or more disclosed embodiments may become apparent upon reading the following detailed description and upon reference to the drawings in which:

FIG. 4 is an upper perspective view of an illustrative substrate, according to one or more embodiments described herein;

FIG. 5 is an upper perspective view of another exemplary device mounting system, according to one or more embodiments described herein;

FIG. 6A is a partial sectional view of the exemplary device mounting system depicted in FIG. 5 taken along sectional line 6A-6A, according to one or more embodiments described herein;

FIG. 6B is a partial sectional view of the exemplary device mounting system depicted in FIG. 5 taken along sectional line 6B-6B, according to one or more embodiments described herein;

FIG. 7 is a partial sectional view of an exemplary electrical device mounting system, according to one or more embodiments described herein; and FIG. 8 is a partial sectional view of another exemplary electrical device mounting system, according to one or more embodiments described herein.

DETAILED DESCRIPTION

Figure 1A:
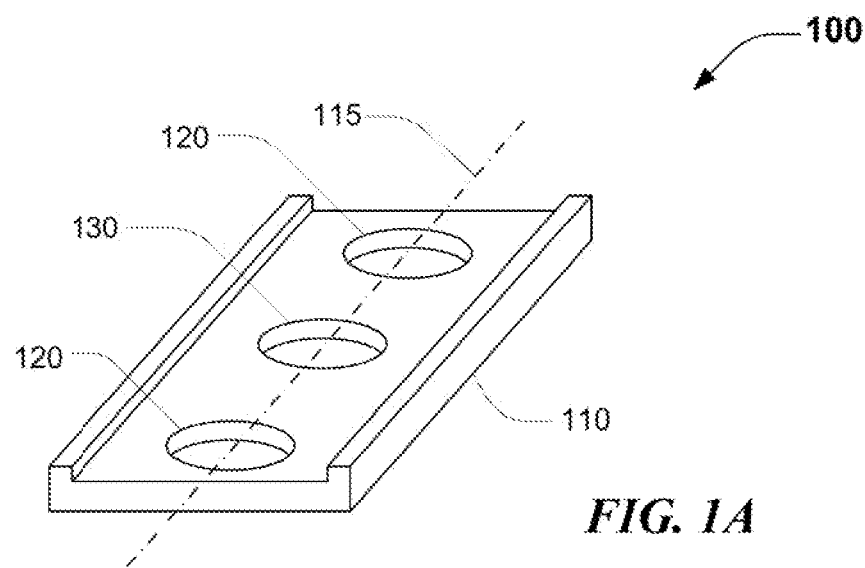
FIG. 1A is a perspective view of an exemplary transition member, according to one or more embodiments described herein.

FIG. 1A is a perspective view of an exemplary transition member 100, according to one or more embodiments. The transition member 100 can be a rigid member 110 having any shape or geometry. In one or more embodiments, the rigid member 110 can be any geometric shape or cross section having a high degree of structural rigidity along the longitudinal axis 115 of the structure, for example the C-section shape depicted in FIG. 1.

A plurality of receiver apertures 120 (two are depicted in FIG. 1) can be disposed in, on, or about the rigid member 110. In one or more embodiments, all or a portion of the plurality of receiver apertures 120 can be adapted to accommodate one or more receivers suitable for the permanent or temporary attachment of one or more devices to the transition member 110. In one or more embodiments, all or a portion of the plurality of receiver apertures 120 can have threads tapped directly into the wall defining the aperture to accommodate the attachment of a threaded device mounting feature. In one or more embodiments, the receiver apertures 120 can have the same or different diameters. In one or more embodiments, the receiver apertures 120 can have a diameter of about 1 mm or more; about 3 mm or more; about 5 mm or more; or about 7 mm or more.

One or more mounting feature apertures 130 can be disposed in, on, or about the rigid member 110. In one or more embodiments, all or a portion of the one or more mounting feature apertures 130 can be adapted to accommodate one or more mounting features suitable for the permanent or temporary attachment of the transition member 100 to a substrate, for example a printed circuit board disposed within an electronic device. In one or more embodiments, the one or more mounting feature apertures 130 can have the same or different diameters. In one or more embodiments, the one or more apertures 130 can have a diameter of about 1 mm or more; about 3 mm or more; about 5 mm or more; or about 7 mm or more.

The transition member 100 can be of any suitably rigid material. In one or more embodiments, the transition member 100 can be an electrically non-conductive material or other similar or related materials unsuitable for the transmission of an electric current, i.e. an insulator. In one or more embodiments, the transition member 100 can be of a material having a high thermal conductivity. In one or more specific embodiments, the transition member 100 can be a fiberglass member, a carbon fiber member, a reinforced phenolic resin member, or the like.

Figure 1B:
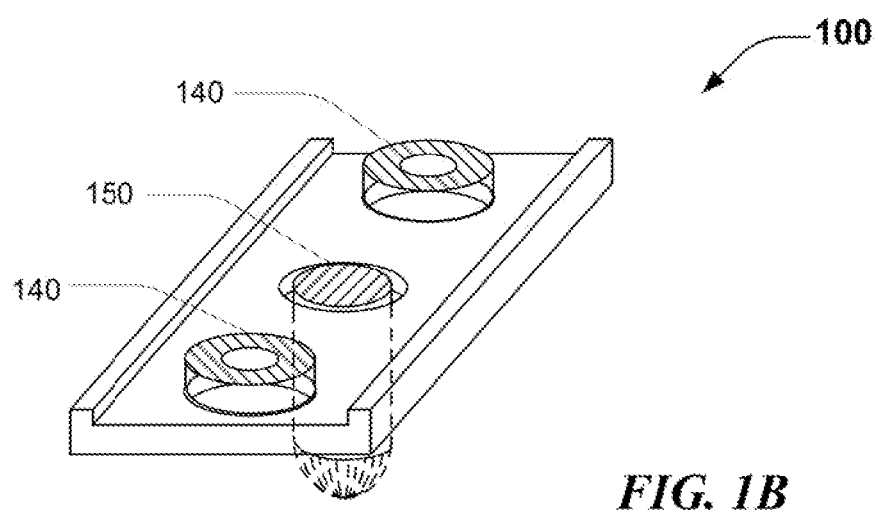
FIG. 1B is a perspective view of another exemplary transition member, according to one or more embodiments described herein.

FIG. 1B is a perspective view of another exemplary transition member 100, according to one or more embodiments. In one or more embodiments, one or more receivers 140 can be disposed in at least a portion of the receiver apertures 120. In one or more embodiments, at least a portion of the one or more receivers 140 can be adapted to accommodate the temporary or permanent attachment of a device mounting feature therein. In one or more embodiments, all or a portion of the one or more receivers 140 can be an elastomeric material to accommodate a frictional attachment of the device mounting feature, for example a post. In one or more embodiments, all or a portion of the one or more receivers 140 can be a resilient material to provide a solid interface to accommodate the attachment of a threaded device mounting feature, for example a screw or stud. In one or more embodiments, all or a portion of the one or more receivers 140 can be an electrically non-conductive material to accommodate the attachment of a deformable device mounting feature, for example a rivet.

A transition mounting feature 150 can be disposed partially or completely within each of the mounting feature apertures 130. In one or more embodiments, the transition mounting feature 150 can include, but is not limited to a post disposed partially or completely within the mounting feature aperture 130 as depicted in FIG. 1B. In one or more embodiments, the transition mounting feature 150 can be a standoff or similar insert adapted to accommodate the partial or complete insertion of a transition mounting feature 150.

Figure 2A:
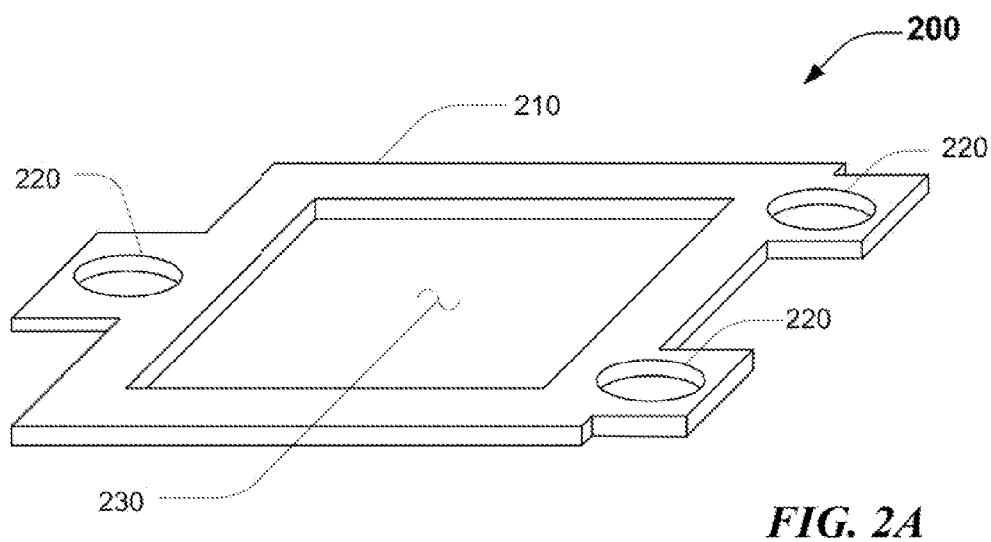
FIG. 2A is an upper perspective view of an exemplary backing member, according to one or more embodiments described herein.

FIG. 2A is an upper perspective view of an exemplary backing member 200, according to one or more embodiments. The backing member 200 can include a rigid member 210 having any shape or geometry. In one or more embodiments, the rigid member 210 can be any geometric shape or cross section having a high degree of structural rigidity, for example the ring-shaped geometry surrounding a central aperture 230 as depicted in FIG. 2A. Other equally efficacious shapes and geometries for the backing member 200 are possible and are included within the scope of this disclosure as one or more additional embodiments.

A plurality of apertures 220 (three are depicted in FIG. 2A) can be disposed in, on, or about the rigid member 210. In one or more embodiments, all or a portion of the plurality of the apertures 220 can be adapted to accommodate one or more receivers suitable for the permanent or temporary attachment of one or more devices to the transition member 210. In one or more embodiments, all or a portion of the plurality of the apertures 220 can have threads tapped directly into the wall defining the aperture 220 to accommodate the attachment of a threaded device mounting feature. In one or more embodiments, all or a portion of the plurality of the apertures 220 can have the same or different diameters. In one or more embodiments, the one or more apertures 220 can have a diameter of about 1 mm or more; about 3 mm or more; about 5 mm or more; or about 7 mm or more.

Figure 2B:
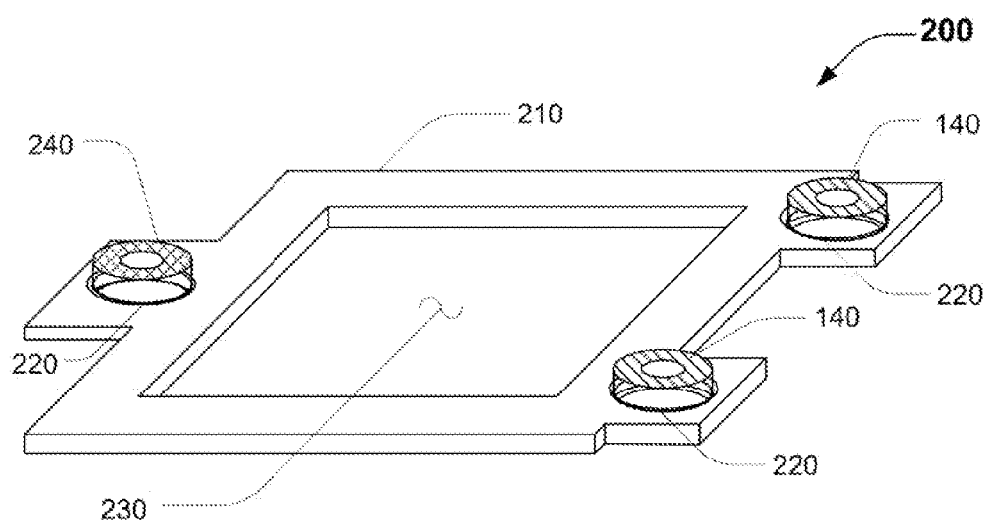
FIG. 2B is an upper perspective view of another exemplary backing member, according to one or more embodiments described herein.

FIG. 2B is an upper perspective view of another exemplary backing member 200, according to one or more embodiments. In one or more embodiments, receivers 140 can be disposed in at least a portion of the one or more apertures 220. In one or more embodiments, as described in detail above with respect to FIG. 1B, at least a portion of the receivers 140 can be adapted to accommodate the temporary or permanent attachment of a device mounting feature therein.

In one or more embodiments, at least one transition mounting receiver 240 can be disposed in at least a portion of the apertures 220. In one or more embodiments, the at least one transition mounting receiver 240 can be adapted to accommodate the temporary or permanent attachment of a transition mounting feature 150 thereto. In one or more embodiments, the transition mounting receiver 240 can be an elastomeric material adapted to accommodate the frictional attachment of the transition mounting feature 150, for example a transition mounting post. In one or more embodiments, the transition mounting receiver 240 can be a resilient material adapted to provide a solid interface to accommodate the attachment of a threaded transition mounting feature 150, for example a screw or a stud. In one or more embodiments, the transition mounting receiver 240 can be an electrically non-conductive material adapted to accommodate the attachment of a deformable transition mounting feature 150, for example a rivet.

Figure 3:
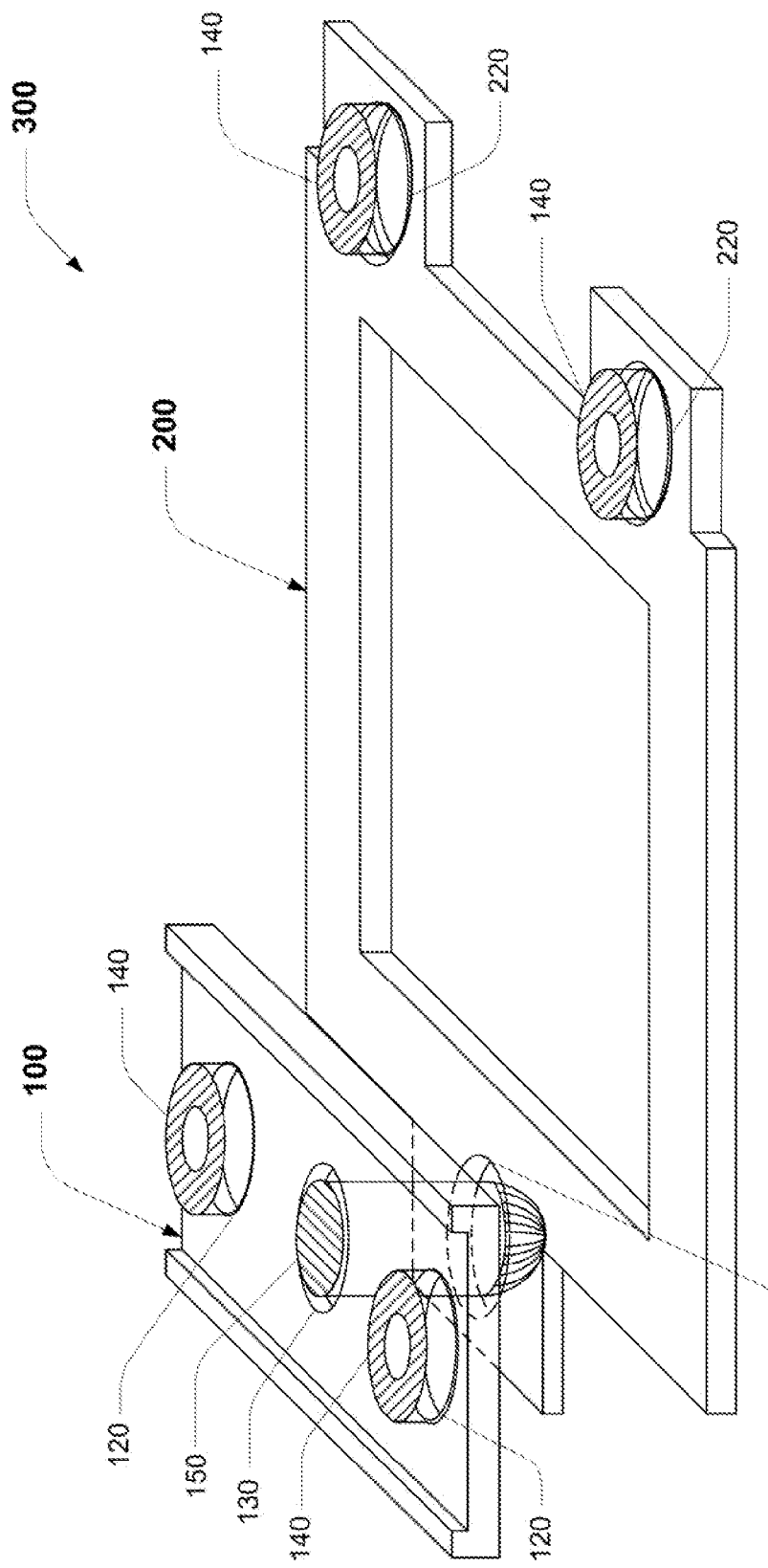
FIG. 3 is an upper perspective view of an exemplary device mounting system, according to one or more embodiments described herein.

FIG. 3 is an upper perspective view of an exemplary device mounting system 300, according to one or more embodiments. In one or more embodiments, the system 300 can include an exemplary transition member 100 attached to an exemplary backing member 200 using, one or more transition mounting features 150 attached to one or more transition mounting receivers 240. In one or more embodiments, the one or more transition mounting features 150 can include, but are not limited to, one or more friction fasteners such as a post, one or more threaded fasteners such as a screw, or one or more deformable fasteners such as a rivet. The one or more transition mounting receivers 240 can include, but are not limited to, threads disposed about the exterior surface of the aperture 220, one or more elastomeric materials adapted to accommodate the frictional attachment of the transition mounting feature 150, one or more resilient materials adapted to provide a solid interface to accommodate the attachment of a threaded transition mounting feature 150, or one or more electrically non-conductive material adapted to accommodate the attachment of a deformable transition mounting feature 150.

As depicted in FIG. 3, in one or more specific embodiments, the transition mounting feature 150 can include a post, and the transition member 100 can be attached to the backing member 200 by disposing the post within an appropriate transition mounting receiver 240, such as an elastomeric receiver 240 to which the post 150 can be attached using frictional forces. In one or more embodiments, a male-threaded transition mounting feature 150 such as a screw can be used in conjunction with a complimentary female-threaded transition mounting receiver 240 to permit the threaded attachment of the transition member 100 to the backing member 200. Similarly, in one or more embodiments, a deformable transition mounting feature 150 such as a rivet can be used in conjunction with a resilient transition mounting receiver 240 to permit the permanent attachment of the transition member 100 to the backing member 200.

After the attachment of the transition member 100 to the backing member 200, a plurality of receivers 140 can be disposed about the attached components. As depicted in FIG. 3, an equal number (two) of receivers 140 can be disposed on the transition member 100 and the backing member 200. In one or more embodiments, the receivers 140 can be unequally distributed between the transition member 100 and the backing member 200, for example two (2) receivers 140 can be distributed on the transition member and four (4) receivers 140 can be distributed on the backing member 200. In one or more embodiments, any number of receivers 140 can be distributed on the transition member 100 and any number of receivers 140 can be distributed on the backing member 200.

FIG. 4. is an upper perspective view of an illustrative substrate 400, according to one or more embodiments. In one or more embodiments, the substrate 400 can include a rigid member 410 having a plurality of substrate apertures 420 disposed therein (three such substrate apertures 420 are depicted in FIG. 4). In one or more embodiments, all or a portion of the one or more substrate apertures 420 can be adapted to accommodate the passage of one or more mounting features, for example the transition mounting feature 150, through the rigid member 410. In one or more embodiments, the one or more substrate apertures 420 can have a diameter of about 1 mm or more; about 3 mm or more; about 5 mm or more; or about 7 mm or more.

The substrate 400 can include any suitably rigid structure, including but not limited to, a single or multi-layer printed circuit board having one or more board-mount electrical devices attached thereto. In one or more embodiments, the substrate 400 can include a single or multi-layer printed circuit board having one or more board-mount and one or more socket-mount electrical devices attached thereto. In one or more embodiments, the substrate 400 can include a printed circuit board disposed partially or completely within a computing device, for example a computing device motherboard; a computing device daughter board; a computing device video board; and a computing device peripheral board.

FIG. 5 is an upper perspective view of another exemplary device mounting system 500, according to one or more embodiments. In one or more embodiments, the substrate 400 can be a substantially planar, rigid, member having a first ("upper") surface 510 and a second ("lower") surface 520. In one or more embodiments, the transition member 100 can be disposed proximate the upper surface 510 of the substrate 400 and the backing member 200 can be disposed proximate the lower surface 520 of the substrate 400.

The terms "upper," "lower" and other like terms used herein refer to relative positions to another and are not intended, nor should be interpreted, to denote a particular absolute direction or spatial orientation. For example, a feature described as being on the "lower" surface of a device could be on the "upper" surface or a "side" surface of the device if the device is rotated or inverted; such rotation or inversion is envisioned to be within the scope of one or more claimed embodiments described herein.

All or a portion of the receivers 140 can be disposed proximate the lower surface 520 of the substrate 400, located proximate one or more substrate apertures 420. Positioning all or a portion of the receivers 140 proximate one or more substrate apertures can permit the disposal of one or more mounting features within the receivers 140 from the upper surface 510 of the substrate 400.

The transition member 100 can be attached to the backing member 200 by the passage of a single transition mounting feature 150 through the substrate aperture 420. After passage through the substrate aperture 420, the transition mounting feature 150 can engage the transition mounting receiver 240 disposed in the backing member 200. In one or more specific embodiments, use of the transition member 100 can reduce the number substrate apertures 420 required to attach a device proximate the upper surface 510 of the substrate 400 to the backing member 200. Reducing the number of substrate apertures 420 can, for example, increase the substrate available for the routing of additional circuitry that would have previously been hindered by the additional substrate apertures 420 in the absence of the transition member 100.

FIG. 6A is a partial sectional view of the exemplary device mounting system 500 depicted in FIG. 5 taken along sectional line 6A-6A, according to one or more embodiments. FIG. 6A provides a clearer view of an exemplary spatial relationship between an illustrative transition member 100, an illustrative backing member 200, and an illustrative substrate 400. In one or more embodiments, the transition member 100 can be disposed proximate the upper surface 510 of the substrate 400 while the backing member 200 can be disposed proximate the lower surface 520 of the substrate 400.

As depicted in FIG. 6A, in one or more embodiments, all or a portion of the receivers 140 disposed on backing member 200 can be located proximate a substrate aperture 420. In one or more embodiments, all or a portion of the receivers 140 disposed on the transition member 100 can be disposed distal from all or a portion of the substrate apertures 420.

FIG. 6B is a partial sectional view of the exemplary device mounting system 500 depicted in FIG. 5 taken along sectional line 6B-6B, according to one or more embodiments. FIG. 6B provides a clearer view of an exemplary spatial relationship between an illustrative transition member 100, an illustrative backing member 200, and an illustrative substrate 400. In one or more embodiments, the transition member 100 can be disposed proximate the upper surface 510 of the substrate 400 while the backing member 200 can be disposed proximate the lower surface 520 of the substrate 400.

As depicted in FIG. 6B, in one or more embodiments, all or a portion of the transition mounting feature 150 can pass through one or more substrate apertures 420. After passing through the substrate aperture 420, all or a portion of the transition mounting feature 150 can be disposed proximate or otherwise attached to all or a portion of a transition mounting receiver 240.

FIG. 7 is a partial sectional view of an exemplary device mounting system 700, according to one or more embodiments. In one or more embodiments, the substrate 400 can include one or more circuit boards disposed at least partially with a computing device. In one or more specific embodiments, the substrate 400 can include, but is not limited to, a computing device motherboard; a computing device daughter board; a computing device video board; and a computing device peripheral board.

In one or more embodiments, a heat-generating device 710 can be mounted or otherwise attached or communicatively coupled to the substrate 400. In one or more embodiments, the heat-generating device 710 can be a single component device, or system. In one or more embodiments, the heat generating device 710 can be a multi-component device or system. In one or more embodiments, the heat generating device 710 can be an electronic device. In one or more embodiments, the heat generating device 710 can include, but is not limited to, an integrated circuit such as a central processing unit ("CPU"); a graphical processing unit ("GPU"); a volatile memory storage unit; and a non-volatile memory storage unit.

A device 720 can be disposed proximate the heat-generating device 710. In one or more embodiments, the device 720 can include a heat dissipating device, for example a passive finned cooler, a forced air finned cooler, a stacked plate cooler, an extruded fin cooler, or any other device in the art suitable for transferring, transporting, or otherwise dissipating all or a portion of the heat generated by the heat-generating device 710. In one or more embodiments, the device 720 can be attached to the electronic device 710 using heat transfer mastic, thermal foil, or the like. In one or more embodiments, the device 720 can be integrally formed with the heat-generating device 710.

In one or more embodiments, a plurality of device mounting features 730, 740 can be disposed in, on, or about the device 720. In one or more embodiments, all or a portion of the device mounting features 730, 740 can be attached to all or a portion of the receivers 140 disposed in, on, or about the transition member 100 and the backing member 200. In one or more specific embodiments, a first portion of device mounting features 730 can be attached to or otherwise disposed in, on, or about, the receivers 140 disposed on the transition member 100. In one or more specific embodiments, the remaining portion of device mounting features 740 can pass through one or more substrate apertures 420 and be attached to or otherwise disposed in, on, or about, the receivers 140 disposed on the backing member 200.

FIG. 8 is a partial sectional view of an exemplary device mounting system 800, according to one or more embodiments. In one or more embodiments, the substrate 400 can include one or more circuit boards disposed at least partially with a computing device. At least a portion of a device 810 can be disposed proximate the heat-generating device 710.

A device 810 can be disposed proximate the heat-generating device 710. In one or more embodiments, the device 810 can include a heat transfer device, such as a heat pipe, heat spreader, or any other device in the art suitable for transferring, transporting, or otherwise dissipating all or a portion of the heat generated by the heat-generating device 710. In one or more embodiments, the device 810 can be attached to the electronic device 710 using heat transfer mastic, thermal foil, or the like. In one or more embodiments, all or a portion of the device 810 can be integrally formed with the heat-generating device 710.

Certain embodiments and features have been described using a set of numerical upper limits and a set of numerical lower limits. It should be appreciated that ranges from any lower limit to any upper limit are contemplated unless otherwise indicated. Certain lower limits, upper limits and ranges appear in one or more claims below. All numerical values are "about" or "approximately" the indicated value, and take into account experimental error and variations that would be expected by a person having ordinary skill in the art.

While the foregoing is directed to embodiments of the present invention, other and further embodiments of the invention may be devised without departing from the basic scope thereof, and the scope thereof is determined by the claims that follow.

What is claimed is:

1. A device mounting system comprising:
    a device;
    a substrate;
    a transition member comprising:
        a transition mounting feature; and
        a first receiver adapted to accommodate a first mounting feature; and
    a backing member comprising:
        a second receiver adapted to accommodate a second mounting feature; and
        a transition mounting receiver adapted to accommodate the transitional mounting feature of the transitional member;
    wherein the transition member is disposed between the device and the substrate, and the substrate is disposed between the transition member and the backing member;
    wherein the transition mounting feature extends through the transition member, the substrate, and the transition mounting receiver on the backing member, but not through the device;
    wherein the first mounting feature extends through the device and the transition member, but not through the substrate and the backing member; and
    wherein the second mounting, feature extends through the device, the substrate, and the backing device, but through the transition mounting feature.

2. The system of claim 1,
    wherein the substrate comprises a first surface and a second surface;
    wherein a first aperture extends from the first surface to the second surface and is adapted to accommodate the second mounting feature;
    wherein a second aperture extends from the first surface to the second surface and is adapted to accommodate the transition mounting feature
    wherein the transition member is disposed proximate the first surface; and
    wherein the backing member is disposed proximate the second surface.

3. The system of claim 2, wherein at least a portion of the substrate comprises a circuit board selected from a group of circuit boards consisting of: a computing device motherboard; a computing device daughter board; a computing device video board; and a computing device peripheral board.

4. The systems of claim 1,
    wherein the transition member further comprises a third receiver adapted to accommodate a third mounting feature; and
    wherein the backing member comprises a fourth receiver adapted to accommodate a fourth mounting feature.

5. The system of claim 1, wherein at least a portion of the device comprises a heat dissipating device disposed proximate one or more heat-generating devices.

6. The system of claim 5, wherein the one or more heat-generating devices is an integrated circuit selected from a group of integrated circuits consisting of: a central processing unit ("CPU"); a graphical processing unit ("CPU"); a volatile memory storage unit; and a non-volatile memory storage unit.

7. The system of claim 1, wherein at least a portion of the device comprises a heat transfer device disposed proximate one or more heat-generating devices.

8. The system of claim 1,
    wherein the first and second mounting features comprise male-threaded fasteners; and wherein the first and second receivers each have a complimentary female thread to each of the male-threaded fasteners of the first and second mounting features, respectively.

9. The system of claim 1, wherein the first and second mounting features comprise deformable fasteners; and
wherein the first and second receivers comprise an electrically non-conductive material.

10. The system of claim 1, wherein the first and second receivers each comprise an elastomeric material.

11. A system for mounting a device, comprising:
a circuit board including a first surface and a second surface;
a transition member disposed between the first surface of the circuit board and the device, the transition member comprising:
  a plurality of receiver apertures disposed therethrough;
  a transition mounting feature; and
  a first receiver at least partially disposed within one of the plurality of receiver apertures disposed in the transition member; and
a backing member disposed proximate the second surface of the circuit board, the backing member comprising:
  a plurality of apertures disposed therethrough;
  a second receiver at least partially disposed within a first one of the plurality of apertures disposed in the backing member; and
  a transition mounting receiver at least partially disposed within a second one of the plurality of apertures disposed in the backing member, the transition mounting receiver adapted to accommodate at least a portion of the transition mounting feature;
a plurality of device mounting features comprising a first portion and a second portion,
wherein each of the first portion of the plurality of device mounting features extend through the device and the transition member, but not the circuit board nor the backing member, the first receiver of the transition member adapted to accommodate one of the first portion of the plurality of device mounting features;
wherein each of the second portion of the plurality of device mounting features extend through the device, the circuit board, and the backing member, but not the transition member, the second receiver of the transition member adapted to accommodate one of the second portion of the plurality of device mounting features; and
wherein the transition mounting feature extends through the transition member, the circuit board, and the backing member, but not the device.

12. The system of claim 11, wherein the plurality of device mounting features and the transition mounting feature comprise male-threaded fasteners; and wherein the first receiver, the second receiver, and the transition mounting receiver each have complimentary female threads to each of the male-threaded fasteners of the plurality of device mounting features.

13. The system of claim 11, wherein the plurality of device mounting features and the transition mounting feature comprise deformable fasteners; and wherein the first receiver, the second receiver, and the transition mounting receiver each comprises an electrically non-conductive material.

14. The system of claim 11, wherein the first receiver, the second receiver, and the transition mounting receiver each comprise an elastomeric material.

15. A system for mounting a device to a circuit board having a first surface and a second surface, the system comprising:
a transition member disposed between the first surface of the circuit board and the device;
a backing member disposed proximate the second surface of the circuit board;
a first device mounting feature extending from the device to the transition member, but not through the circuit board and the backing member;
a second device mounting feature extending from the device, through the circuit board, to the backing member, but not through the transition member; and
a transition mounting feature extending from the transition member, through the circuit board, to the backing member, but not through the device.

16. The system of claim 15, further comprising:
a first receiver disposed on the transition member and having a set of female threads that correspond to a set of male threads disposed on the first device mounting feature; and
a second receiver disposed on the backing member and having a set of female threads that correspond to a set of male threads disposed on the second device mounting feature.

17. The system of claim 16, wherein the first receiver and the second receiver each comprise an electrically non-conductive material.

* * * * *

UNITED STATES PATENT AND TRADEMARK OFFICE
CERTIFICATE OF CORRECTION

PATENT NO.        : 8,797,744 B2                                                Page 1 of 1
APPLICATION NO.   : 13/386974
DATED             : August 5, 2014
INVENTOR(S)       : David W. Cawthon et al.

It is certified that error appears in the above-identified patent and that said Letters Patent is hereby corrected as shown below:

In the Claims

In column 8, line 27, in Claim 1, delete "mounting," and insert -- mounting --, therefor.

In column 8, line 28, in Claim 1, delete "device," and insert -- member, --, therefor.

In column 8, line 28, in Claim 1, delete "but" and insert -- but not --, therefor.

In column 8, line 38, in Claim 2, delete "feature" and insert -- feature; --, therefor.

In column 8, line 48, in Claim 4, delete "systems" and insert -- system --, therefor.

In column 8, line 60, in Claim 6, delete "("CPU");" and insert -- ("GPU"); --, therefor.

Signed and Sealed this
Eighteenth Day of November, 2014

Michelle K. Lee
*Deputy Director of the United States Patent and Trademark Office*